United States Patent [19]

Ando

[11] Patent Number: 4,907,045
[45] Date of Patent: Mar. 6, 1990

[54] RESONANT-TUNNELING FUNCTIONAL DEVICE USING MULTIPLE NEGATIVE DIFFERENTIAL RESISTANCES

[75] Inventor: Yuji Ando, Tokyo, Japan

[73] Assignee: NEC Corporation, Tokyo, Japan

[21] Appl. No.: 209,718

[22] Filed: Jun. 22, 1988

[30] Foreign Application Priority Data

Jun. 22, 1987 [JP] Japan .................. 62-155769

[51] Int. Cl.⁴ ............................... H01L 29/80
[52] U.S. Cl. .......................... 357/22; 357/4; 357/16; 307/279; 307/304
[58] Field of Search ............ 357/22 A, 22 I, 4, 48 L, 357/16, 23.2, 23.7; 307/279, 283, 304

[56] References Cited

U.S. PATENT DOCUMENTS 4,721,983  1/1988  Frazier ........................... 357/23.2
4,806,998  2/1989  Vinter et al. ....................... 357/4

OTHER PUBLICATIONS

Applied Physics Letters, vol. 51(7), pp. 526-531 by Capasso et al, Aug. 1987.

*Primary Examiner*—Andrew J. James
*Assistant Examiner*—Mark Prenty
*Attorney, Agent, or Firm*—Sughrue, Mion, Zinn, Macpeak & Seas

[57] ABSTRACT

There is described a functional device constructed with a semi-insulating substrate, a channel layer of a conductive compound semiconductor formed on the semi-insulating substrate, a channel electrode coupled to a first area of the channel layer, a gate electrode coupled to a second area of the channel layer, first and second resonant tunneling diodes formed on third and fourth areas of the channel layer intervening the second area, a source electrode formed on the first resonant tunneling diode, and a drain electrode formed on the second resonant tunneling diode. The functional device may be applied to many function circuits such as a bistable multi-vibrator or memory cell, and a frequency multiplier with addition of a few circuit elements or wirings.

11 Claims, 2 Drawing Sheets

RESONANT-TUNNELING FUNCTIONAL DEVICE USING MULTIPLE NEGATIVE DIFFERENTIAL RESISTANCES

BACKGROUND OF THE INVENTION

1. Field of the Invention:

This invention relates to a functional device using a resonant tunneling effect, and more particularly to a structure of the device applicable to a variety of function circuits.

2. Description of the Related Arts:

Heretofore, high-speed operation in integrated circuits has been improved by miniaturizing circuit elements in the integrated circuits in order to have a transmission time of about 10 pico-seconds. The miniaturization for decreasing the transmission time has almost reached a limit. On the contrary, the time delay due to wirings becomes relatively serious for further improvement of high-speed operation. Thus, there is a new trend that functional devices are used for decreasing the number of wirings and for shortening a total delay time to achieve improved high-speed operation.

A.R. Bonnefoi et al. proposed a resonant-tunneling transistor in "IEEE ELECTRON DEVICE LETTERS" vol. EDL-6, No. 12 (December 1985) pages 636 to 638. The transistor is an MESFET having a resonant-tunneling diode in its source electrode region. A negative differential resistance appears in a current flowing between drain and source electrodes and is controlled by a gate voltage.

This MESFET is constructed of compound semiconductors of GaAs and AlGaAs to achieve a high-speed operation in microwave and millimeter-wave regions. Furthermore, since the MESFET shows negative differential resistance, it has multiple applications such as high-speed digital circuits, tunable millimeter-wave oscillators and negative resistance amplifiers.

Although this MESFET is a functional device presenting a negative differential resistance, many elements and wirings are required for forming circuits such as flip-flops, frequency multipliers and logic circuits. The wirings deteriorate the high-speed operation to prolong the delay time.

SUMMARY OF THE INVENTION

It is a primary object of the present invention to provide a functional device operable at a high-speed and applicable to various functional circuits with a decreased number of wirings and/or elements.

According to the present invention, there is provided a functional device including a semiconductor layer having a channel layer at a surface adjacent portion, a gate electrode coupled to a limited area of the channel layer, first and second resonant tunneling diodes each disposed on first and second areas of a surface of the semiconductor layer intervening the limited area, a source electrode formed on the first resonant tunneling diode, a drain electrode formed on the second resonant tunneling diode and a channel electrode coupled to the channel layer The first and second resonant tunneling diodes are formed with, for the N-tpye channel region, a quantum well layer having a resonant state of electrons and layers of quantum barrier intervening the quantum well layer, the quantum barrier layers having such a thickness that electrons may pass by tunneling effect and an electron affinity smaller than that of the quantum well layer. For the P-type channel region, a quantum well layer having a resonant state of holes and layers of quantum barrier intervening the quantum well layer, the quantum barrier layers having such a thickness that holes may pass by tunneling effect and a total energy of electron affinity and energy band gap larger than that of the quantum well layer.

The functional device according to the present invention is formed with the use of compound semiconductors having large mobilities, because the quantum well structure can be formed by compound semiconductors Therefore, high-speed operation can be obtained, compared to conventional silicon devices. The high-speed operation is further improved by forming various circuits with use of the functional device of the present invention, because a number of wirings and/or other circuit elements is decreased as explained below.

The resonant tunneling diodes show a negative resistance in current-voltage (I-V) characteristics The negative resistance characteristics of the first and second resonant tunneling diodes are in a reversed relationship to each other with respect to the voltage at the channel layer. That is, while drain current-channel layer voltage characteristics of one resonant tunneling diode is a type of letter "N", the source current-channel layer voltage characteristics of the other resonant tunneling diode is a type of reversed "N". Furthermore, the channel layer voltage at which the negative resistance is generated is controllable with source-drain voltage.

From those features, two I-V curves change their overlapping condition with an increase in source-drain voltage, to show a periodic change in the drain current. That is, if the source-drain voltage increases up to a first predetermined voltage which is a value of two times of a threshold voltage Vt for negative resistance, the drain current increases. At the first predetermined voltage, the drain current spontaneously decreases due to the negative resistance portions of the I-V curves If the source-drain voltage increases from the first predetermined voltage up to a second predetermined voltage which is a value of four times of a threshold voltage Vt for negative resistance, the drain current again increases At the second predetermined voltage, the drain current again decreases due to the negative resistance portions of the I-V curves. Thereafter, the drain current resumes the increase with the increase of the source-drain voltage from the second predetermined voltage The value of drain current may be controlled by a voltage applied to the gate electrode.

This periodic change in drain current allows the functional device according to the present invention to be used in many function circuits. A bistable multi-vibrator may be formed by connecting one load resistor to the channel electrode. The bistable multi-vibrator may be used as a memory cell. A frequency multiplier is formed by applying an input signal to the drain electrode and connecting a load resistor to the source electrode.

BRIEF DESCRIPTION OF THE DRAWINGS

The above and further objects, features and advantages of the present invention will become more apparent from the following detailed description taken in conjunction with the accompanying drawings, wherein.

DESCRIPTION OF THE PREFERRED EMBODIMENTS

Figure 1:
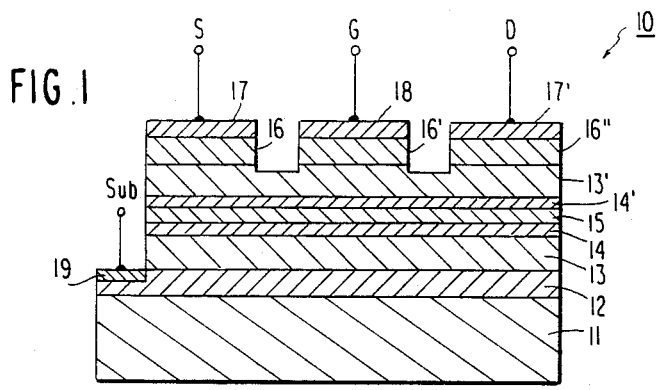
FIG. 1 is a sectional view of a preferred embodiment according to the present invention.

A functional device 10 of a preferred embodiment according to the present invention is formed on a semi-insulating GaAs substrate 11 with use of compound semiconductors, as shown in FIG. 1. A channel layer 12 is formed on the semi-insulating GaAs substrate 11 with an N-type GaAs having an impurity concentration of $5 \times 10^{17}$ cm$^{-3}$ and a thickness of 100 Å. A channel electrode 19 is ohmicly contacted to a peripheral surface of the channel layer 12. A first spacer 13 is deposited on the channel layer 12 with an impurity-non-doped GaAs having a thickness of 50 Å which is preferably selected from a range between 20 Å and 200 Å to restrain an internal resistance. A first quantum barrier layer 14 is piled on the first spacer 13 with an impurity-non-doped $Al_{0.3}Ga_{0.7}As$ having a thickness of 30 Å which should be such a thickness that electrons may pass by a tunneling effect and which is preferably selected from a range between 10 Å and 100 Å. A quantum well layer 15 overlays the first quantum barrier layer 14 with an impurity-non-doped $In_{0.1}Ga_{0.9}As$ having a thickness of 50 Å which is preferably selected from a range between 10 Å and 500 Å. A second quantum barrier layer 14' of an impurity non-doped $Al_{0.3}Ga_{0.7}As$ and a second spacer 13' of an impurity-non-doped GaAs are consecutively deposited on the quantum well layer 15 with thickness of 30 Å and 50 Å, respectively. The thicknesses of those second quantum barrier layer 14' and second spacer 13' should be designed similarly to the cases of the first quantum barrier 14 and first spacer 13. Three contact layers 16, 16' and 16" are deposited on the second spacer 14' and are separated from each other. The contact layers 16, 16' and 16" are made of N-type GaAs. A source electrode 17 and drain electrode 17' are respectively formed on the contact layers 16 and 16" with metals which form ohmic contacts to the contact layers 16 and 16". A gate electrode 18 is formed on the contact layer 16' with a metal forming a schottky contact to the contact layer 16'.

The N-GaAs channel layer 12, the first GaAs spacer 13, the first $Al_{0.3}Ga_{0.7}As$ quantum barrier layer 14, the $In_{0.1}Ga_{0.9}As$ quantum well layer 15, the second $Al_{0.3}Ga_{0.7}As$ quantum barrier layer 14', the second GaAs spacer 13' and an N-GaAs contact layer are consecutively deposited on the semi-insulating GaAs substrate by molecular beam epitaxy. Thereafter, the N-GaAs contact layer is selectively etched to form three separated contact layers 16, 16' and 16". The functional device 10 according to the preferred embodiment is achieved by contacting ohmic metals to the contact layers 16 and 16" to form source and drain electrodes 17 and 17' and a schottky metal to the contact layer 16' to form a drain electrode 18.

The quantum well layer 15 and the first and second quantum barrier layers 14 and 14' form a quantum tunneling diode. Therefore, two quantum tunneling diodes are included in a path between source and drain electrodes 17 and 17'. One exists in a path between the drain electrode 17' and the channel layer 12. The other is in a path between the channel layer 12 and the source electrode 17. The quantum tunneling diodes exhibit a letter "N" shape characteristics between the current flowing therethrough and the voltage applied thereto. However, since those two quantum tunneling diodes are commonly connected to the channel layer 12 and allow the same current to flow, the letter "N" shape characteristics of the two quantum tunneling diodes have a reversed relationship with respect to the applied voltages having a reference at the channel layer 12. Those reversed characteristics overlap each other. The overlap condition can be controlled by the voltage applied between the source and drain electrodes 17 and 17', as explained below with reference to FIGS. 2(a), 2(b) and 2(c).

Figure 2A:
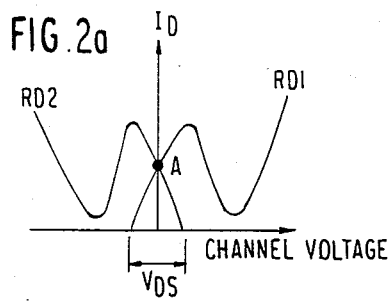
FIGS. 2(a), 2(b) and 2(c) are graphs showing a change in current-channel layer voltage characteristics
Figure 2B:
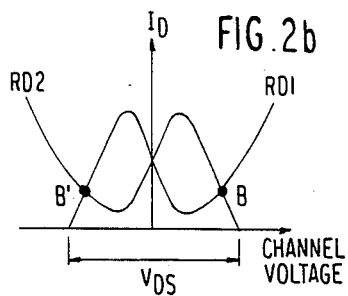
Figure 2C:
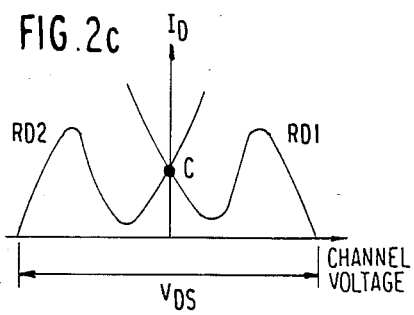
Figure 3:
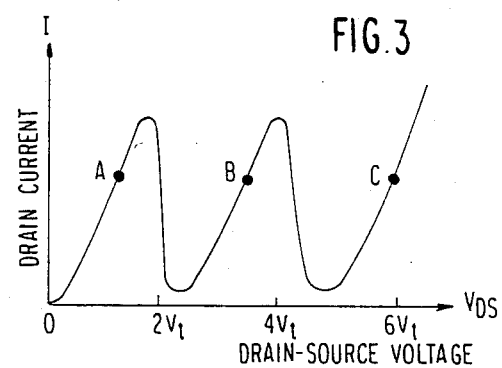
FIG. 3 is a graph showing a drain current-source-drain voltage characteristics of the preferred embodiment.
Figure 4:
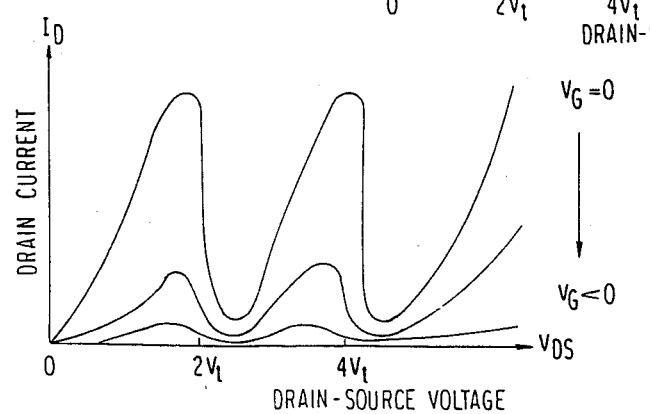
FIG. 4 is a graph showing a change in a drain current-source-drain voltage characteristics with a gate voltage.

In FIGS. 2(a), 2(b) and 2(c), RD1 and RD2 denote characteristics of the quantum tunneling diodes between the drain electrode 17' and the channel layer 12 and between the channel layer 12 and the source electrode 17. When the source-drain voltage $V_{DS}$ increases its value up to a first predetermined voltage which is a value of two times of a threshold voltage Vt for negative resistance, the two curves of the characteristics RD1 and RD2 cross at one point A to allow a drain current corresponding to the point A to flow, as shown in FIG. 2(a). The drain current increases with the increase of the source-drain voltage $V_{DS}$. When the source-drain voltage $V_{DS}$ becomes higher than the first predetermined voltage but lower than a second predetermined voltage which is a value of four times of a threshold voltage $V_t$ for negative resistance, two curves cross at three points but show two stable points B and B' to allow a drain current corresponding to the point B or B' to flow, as shown in FIG. 2(b). The drain current corresponding to the points B or B' spontaneously drops its value at the first predetermined voltage of the source-drain voltage $V_{DS}$, and then again increases with an increase of the source-drain voltage $V_{DS}$. When the source-drain voltage $V_{DS}$ increases above the second predetermined voltage, two curves cross at one point C again to flow a drain current corresponding to the point C to flow, as shown in FIG. 2(c). The drain current spontaneously drops at the second predetermined voltage of the source-drain voltage $V_{DS}$ and then resumes an increase with an increase of the source-drain voltage $V_{DS}$. Thus, the drain current shows a periodic change with an increase of the source-drain voltage $V_{DS}$, as shown in FIG. 3 in which $V_t$ denotes a threshold voltage for negative resistance applied across a quantum tunneling diode when it shows a negative resistance. The drain current periodically drops at the source-drain voltages $V_{DS}$ of $2 \cdot V_t$ and $4 \cdot V_t$. The drain current may be controlled, as shown in FIG. 4, by controlling a voltage applied to the gate electrode 18.

Figure 5A:
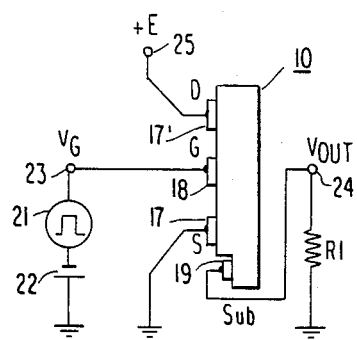
FIGS. 5(a) and 5(b) are a schematic view of a bistable multi-vibrator using the preferred embodiment and a drawing showing wave-forms of gate and channel voltages.

Using the functional device 10 of the preferred embodiment according to the present invention, a bistable multi-vibrator may be formed with a few wirings and one load resistor $R_1$, as shown in FIG. 5(a). The source electrode 17 is grounded. The drain electrode 17' is supplied with a power voltage +E through a power terminal 25. The gate electrode 18 is connected to an input terminal 23 to which an input signal $V_G$ from a signal source 21 is applied with a bias voltage from a bias generator 22. The channel electrode 19 is connected to an output terminal 24 and then is grounded through a load resistor $R_1$. This bistable multi-vibrator may be used as a memory element formed with one functional device and one resistor.

Figure 5B:
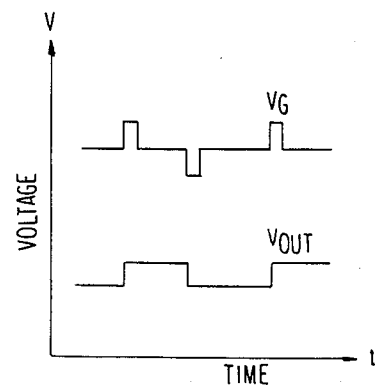

The power voltage +E is selected between two times and four times of the threshold voltage Vt at which the diode generates a negative resistance. An example of the power voltage +E is +1.0 volt. Two I-V curves of the two quantum tunneling diodes in the functional device 10 overlap as shown in FIG. 2(b). If the input signal $V_G$ is a positive-going pulse, the operating point in the drain current-channel potential characteristics of FIG. 2(b) moves to a stable point B to raise the output signal $V_{out}$. On the contrary, if the input signal $V_G$ is a negative-going pulse, the operating point moves to the other stable point B' to lower the output signal $V_{out}$. Thus, the circuit of FIG. 5(a) shows a bistable operation, as shown in FIG. 5(b).

Another application of the functional device 10 is a frequency multiplier shown in FIGS. 6(a) to 6(d). The drain electrode 17' is connected to an input terminal 31 to receive an input signal $V_{in}$ from a signal source 32 with a bias voltage from a bias voltage generator 33. The source electrode 17 is connected to an output terminal 34 to derive an output signal $V_{out}$ and then grounded through a load resistor $R_2$.

Figure 6A:
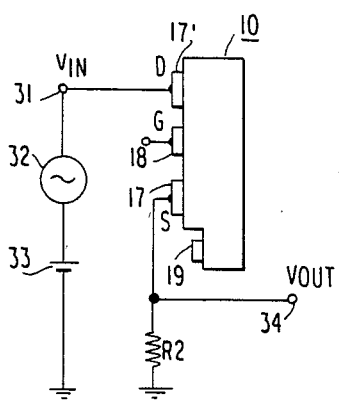
FIG. 6(a) is a schematic view of a frequency multiplier using the preferred embodiment.
Figure 6B:
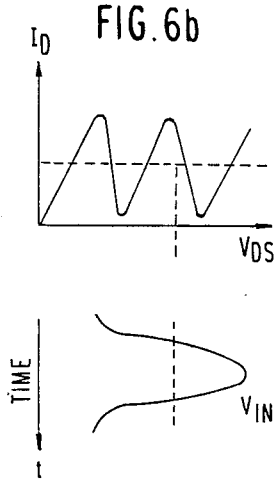
FIG. 6(b) is a graph showing drain current-source-drain voltage characteristics of the preferred embodiment and FIG. 6(c) and 6(d) are drawings showing waveforms of input and output voltages.
Figure 6C:
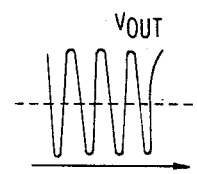
Figure 6D:
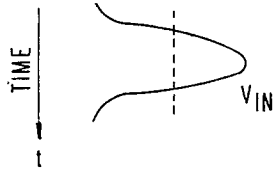

The operation of the frequency multiplier will be easily understood from FIG. 6(b) which is similar to FIG. 3 showing a relationship between the source-drain voltage and the drain current, FIG. 6(d) which is an input signal wave, and FIG. 6(c) which is an output signal wave. As the input signal $V_{in}$, a sine-wave signal having a peak voltage of about six times of the threshold voltage $V_t$ for negative resistance is applied to the drain electrode 17'. As increasing the voltage of the input signal $V_{in}$, the drain current repeats four times of increments and decrements in a one period of input signal $V_{in}$. The drain current is converted into a voltage form to be driven as the output voltage $V_{out}$.

Although the above-explained functional device 10 is an example using a tunneling effect of electrons, a functional device using a tunneling effect of holes may be achieved on a semi-insulating GaAs substrate. A channel layer of P-type GaAs is deposited on the semi-insulating GaAs substrate with an impurity concentration of $1 \times 10^{18}$ cm$^{-3}$ and a thickness of 100 Å by a molecular beam epitaxy. A channel electrode is formed on the channel layer. Thereafter, a first spacer of impurity non-doped GaAs having a thickness of 50 Å, a first quantum barrier layer of impurity non-doped $Al_{0.5}Ga_{0.5}As$ having a thickness of 30 Å, a quantum well layer of impurity non-doped GaAs having a thickness of 50 Å, a second quantum barrier layer of impurity non-doped $Al_{0.5}Ga_{0.5}As$ having a thickness of 30 Å and a second spacer of impurity non-doped GaAs having a thickness of 50 Å are consecutively deposited on the channel layer by molecular beam epitaxy. After P-type GaAs having an impurity concentration of $1 \times 10^{18}$ cm$^{-3}$ and a thickness of 200 Å is deposited on the second spacer by a molecular beam epitaxy, the P-type GaAs is selectively etched away to be divided into three parts of a source contact layer, a gate contact layer and a drain contact layer. Source and drain electrodes are formed by depositing ohmic metals on the source and drain contact layers. A gate electrode is simlarly formed by depositing a shottky-barrier metal on the gate contact layer. Thus, the obtained functional device using a tunneling effect of holes is similarly used as the functional device 10 employing a tunneling effect of electrons.

The combination of compound semiconductors for forming the quantum tunneling diode may be changed to any combination of compound semiconductors other than above-mentioned combinations. The compound semiconductors in the combination should be selected by a resonant state in accordance with a threshold voltage for negative resistance to be obtained.

As above-mentioned, according to the present invention, there is provided a functional device which shows two negative resistances in drain current for a change in source-drain voltage and which allows the drain current value to be controlled in accordance with the gate voltage and which operates at high speed. The functional device can be applied to many function circuits such as a bistable multi-vibrator, a memory and a frequency multiplier with the addition of few circuit elements and/or wirings.

What is claimed is:

1. A functional device comprising:
    a substrate having a channel layer of conductive semiconductor material formed at a surface of said substrate;
    a gate electrode means formed on a first area of said channel layer for controlling conductivity of said channel layer in accordance with a gate voltage applied to said gate electrode;
    a source region formed in contact with a second area of said channel layer on one side of said first area;
    a drain region formed in contact with a third area of said channel layer on an opposite side of said first area to said second area;
    a source electrode formed on said source region, said source region having a resonant tunneling barrier therein to form a first resonant tunneling diode together with said second area of said channel layer and said source electrode;
    a drain electrode formed on said drain region, said drain region having another resonant tunneling barrier therein to form a second resonant tunneling diode together with said third area of said channel layer and said drain electrode; and
    a channel electrode formed on a fourth area of said channel layer.

2. A functional device as claimed in claim 1, wherein said channel layer is made of an N-type compound semiconductor, said resonant tunneling barriers being formed of a quantum well layer of a first compound semiconductor having a first electron affinity and a resonant state of electrons, and first and second quantum barrier layers formed on and below said quantum well layer, respectively, said first and second quantum barrier layers being made of a second compound semiconductor having a second electron affinity smaller than said first affinity and of such a thickness that electrons may pass by a tunneling effect.

3. A functional device as claimed in claim 2, wherein said first compound semiconductor is a mixed semiconductor of InGaAs and said second compound semiconductor is a mixed semiconductor of AlGaAs.

4. A functional device as claimed in claim 3, wherein said N-type compound semiconductor is GaAs, and spacer layers are interposed between said channel layer and said resonant tunneling barriers in said source and drain regions, between said resonant tunneling barrier in said source regions and said source electrode and between said resonant tunneling barrier in said drain regions and said drain electrode.

5. A functional device as claimed in claim 1, wherein said channel layer is made of a P-type compound semiconductor, said resonant tunneling barriers being formed of a quantum well layer of a first compound semiconductor having a first energy sum of electron affinity and energy band gap and a resonant state of holes and first and second quantum barrier layers formed on and below said quantum well layer, respectively, said first and second quantum barrier layers being made of a second compound semiconductor having a second energy sum of electron affinity and energy band gap larger than said first energy sum.

6. A functional device as claimed in claim 5, wherein said first compound semiconductor is GaAs, and said second compound semiconductor is a mixed semiconductor of AlGaAs.

7. A functional device as claimed in claim 6, wherein said P-type compound semiconductor is GaAs, and spacer layers are interposed between said channel layer and said resonant tunneling barriers in said source and driven regions, between said resonant tunneling barrier in said source region and said source electrode and between said resonant tunneling barrier in said drain region and said drain electrode.

8. A functional device as claimed in claim 1, wherein said first and second resonant tunneling diodes are formed of a continuous quantum well layer and two continuous quantum barrier layers formed on and below said continuous quantum well layer, respectively, said continuous quantum well and quantum barrier layers including a portion forming said first resonant tunneling diode, a portion forming said second resonant tunneling diode and a portion included in said gate electrode means.

9. A functional device as claimed in claim 8, wherein a first spacer of impurity non-doped compound semiconductor is interposed between said channel layer and a lower layer of said quantum barrier layers, a second spacer of impurity non-doped compound semiconductor being further interposed between said source and drain electrodes and an upper layer of said quantum barrier layers, said second spacer being formed of a continuous layer which includes a portion of said gate electrode means.

10. A bistable multi-vibrator comprising:
a functional device including a channel layer having a channel electrode, a gate electrode formed on said channel layer to control conductivity of said channel layer, a source electrode, a first resonant tunneling diode interposed between said source electrode and said channel layer, a drain electrode and a second resonant tunneling diode interposed between said drain electrode and said channel layer;
an input terminal coupled to said gate electrode;
a power terminal coupled to said drain electrode;
a reference potential terminal coupled to said source electrode;
an output terminal coupled to said channel electrode; and
a load impedance coupled between said channel electrode and said reference potential terminal.

11. A frequency multiplier comprising:
a functional device including a channel layer having a channel electrode, a gate electrode formed on said channel layer to control conductivity of said channel layer, a source electrode, a first resonant tunneling diode interposed between said source electrode and said channel layer, a drain electrode and a second resonant tunneling diode interposed between said drain electrode and said channel layer;
an input terminal coupled to said drain electrode to receive an input signal of a first frequency;
an output terminal coupled to said source electrode to derive an output signal having a second frequency which is a multiple times of said first frequency;
a reference potential terminal; and
a load impedance coupled between said source electrode and said reference terminal.

* * * * *